United States Patent
Ogasawara et al.

(10) Patent No.: US 9,997,748 B2
(45) Date of Patent: Jun. 12, 2018

(54) POWER SUPPLY DEVICE

(71) Applicant: YAZAKI CORPORATION, Minato-ku, Tokyo (JP)

(72) Inventors: Shigeyuki Ogasawara, Kakegawa (JP); Shinichi Yanagihara, Kakegawa (JP); Michio Ota, Kakegawa (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 495 days.

(21) Appl. No.: 14/372,480

(22) PCT Filed: Jan. 11, 2013

(86) PCT No.: PCT/JP2013/000072
§ 371 (c)(1),
(2) Date: Jul. 16, 2014

(87) PCT Pub. No.: WO2013/111522
PCT Pub. Date: Aug. 1, 2013

(65) Prior Publication Data
US 2014/0356693 A1   Dec. 4, 2014

(30) Foreign Application Priority Data

Jan. 27, 2012  (JP) ................. 2012-015342

(51) Int. Cl.
*H01M 2/06*  (2006.01)
*H01M 2/02*  (2006.01)
(Continued)

(52) U.S. Cl.
CPC .............. *H01M 2/06* (2013.01); *H01M 2/02* (2013.01); *H01M 2/1077* (2013.01);
(Continued)

(58) Field of Classification Search
CPC ....... H01M 2/1077; H01M 2/20–2/208; H01R 11/288
See application file for complete search history.

(56) References Cited

U.S. PATENT DOCUMENTS

| 8,652,677 B2 | 2/2014 | Matthias | |
| 2006/0270286 A1* | 11/2006 | Zhao | H01M 2/206 439/840 |

(Continued)

FOREIGN PATENT DOCUMENTS

| CN | 101689626 A | 3/2010 |
| CN | 201601181 U | 10/2010 |

(Continued)

OTHER PUBLICATIONS

Communication dated May 3, 2016, from the State Intellectual Property Office of People's Republic of China in counterpart Application No. 201380006664.2.

(Continued)

*Primary Examiner* — Stephan Essex
(74) *Attorney, Agent, or Firm* — Sughrue Mion, PLLC

(57) ABSTRACT

A power supply device (1) includes a battery cell assembly (2) being an assembly of battery cells (3) each having electrodes (4) and a battery connecting block (10) including a case body (11) including an adjacent first and second divided fixing portions (12, 13) connected to each other via a flexural deformation portion (14). The flexural deformation portion (14) includes a first rising linear portion (40) having one end fixed to the first divided fixing portion, a second rising linear portion (40) having one end fixed to the second divided fixing portion, first and second curve portions (41) bent at the other ends of the first and second rising linear portions (40) in a direction to come close to each (Continued)

other, and a linear portion (42) connecting the first and second curve portions to each other.

9 Claims, 6 Drawing Sheets

(51) Int. Cl.
*H01M 2/10* (2006.01)
*H01M 2/20* (2006.01)
*H01M 10/48* (2006.01)
*H01R 11/28* (2006.01)
*G01R 31/36* (2006.01)
*H01M 10/42* (2006.01)

(52) U.S. Cl.
CPC ......... *H01M 2/206* (2013.01); *H01M 10/482* (2013.01); *H01R 11/288* (2013.01); *G01R 31/3696* (2013.01); *H01M 2010/4271* (2013.01)

(56) References Cited

U.S. PATENT DOCUMENTS

| | | |
|---|---|---|
| 2010/0183905 A1 | 7/2010 | Matthias |
| 2011/0064986 A1 | 3/2011 | Ogasawara et al. |
| 2012/0100761 A1* | 4/2012 | Gro e .................... H01M 2/202 439/774 |
| 2012/0231320 A1* | 9/2012 | Heck ................... H01M 2/1077 429/121 |
| 2013/0071721 A1 | 3/2013 | Ogasawara et al. |
| 2014/0113179 A1 | 4/2014 | Matthias |

FOREIGN PATENT DOCUMENTS

| | | | |
|---|---|---|---|
| JP | 2010-170884 A | 8/2010 | |
| JP | 2011-238544 A | 11/2011 | |
| WO | WO 2010142679 A1 * | 12/2010 | ............ H01M 2/202 |
| WO | WO 2011038908 A1 * | 4/2011 | .......... H01M 2/1077 |
| WO | 2011/142201 A1 | 11/2011 | |

OTHER PUBLICATIONS

International Search Report of PCT/JP2013/000072, dated May 21, 2013.

Communication dated Nov. 4, 2015 from the State Intellectual Property Office of the People's Republic of China in counterpart application No. 201380006664.2.

Communication dated Jan. 18, 2018, from European Patent Office in counterpart application No. 13706748.4.

* cited by examiner

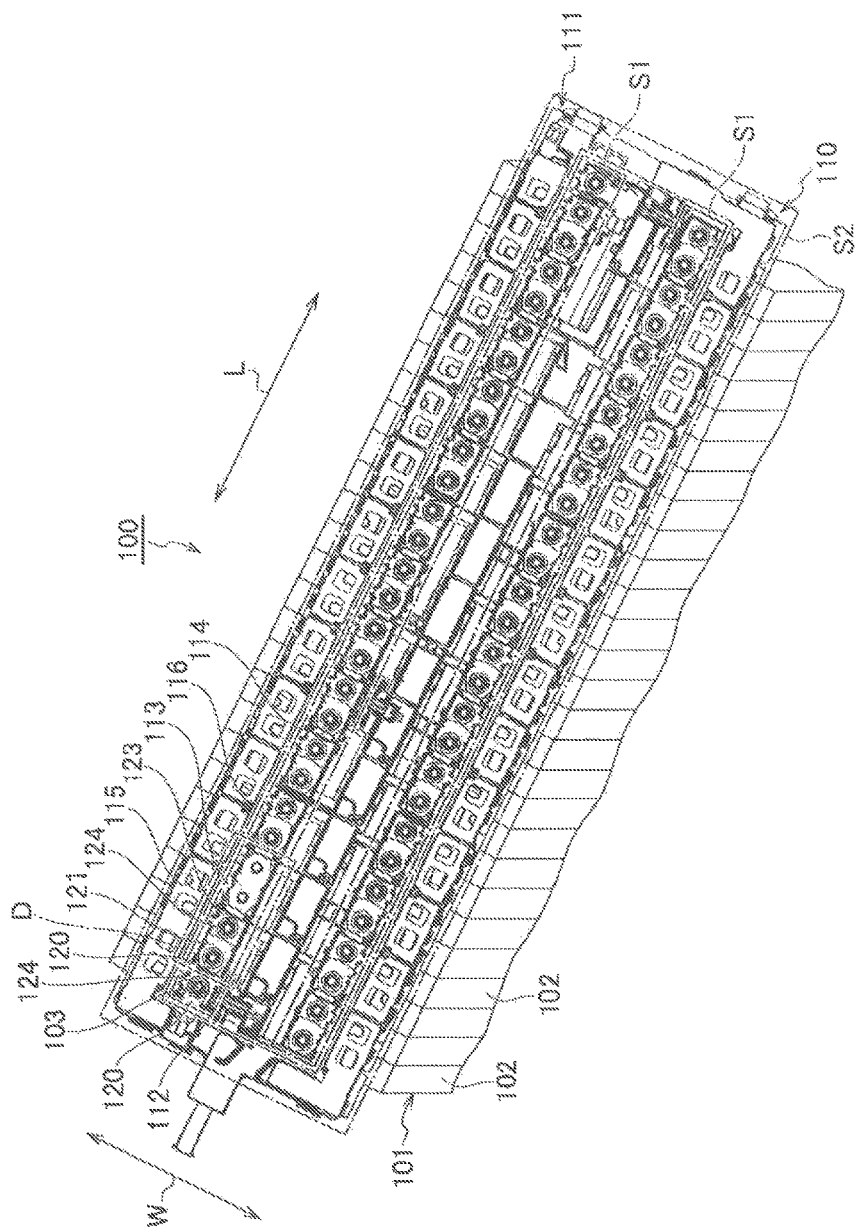
[Fig. 1]

[Fig. 2]
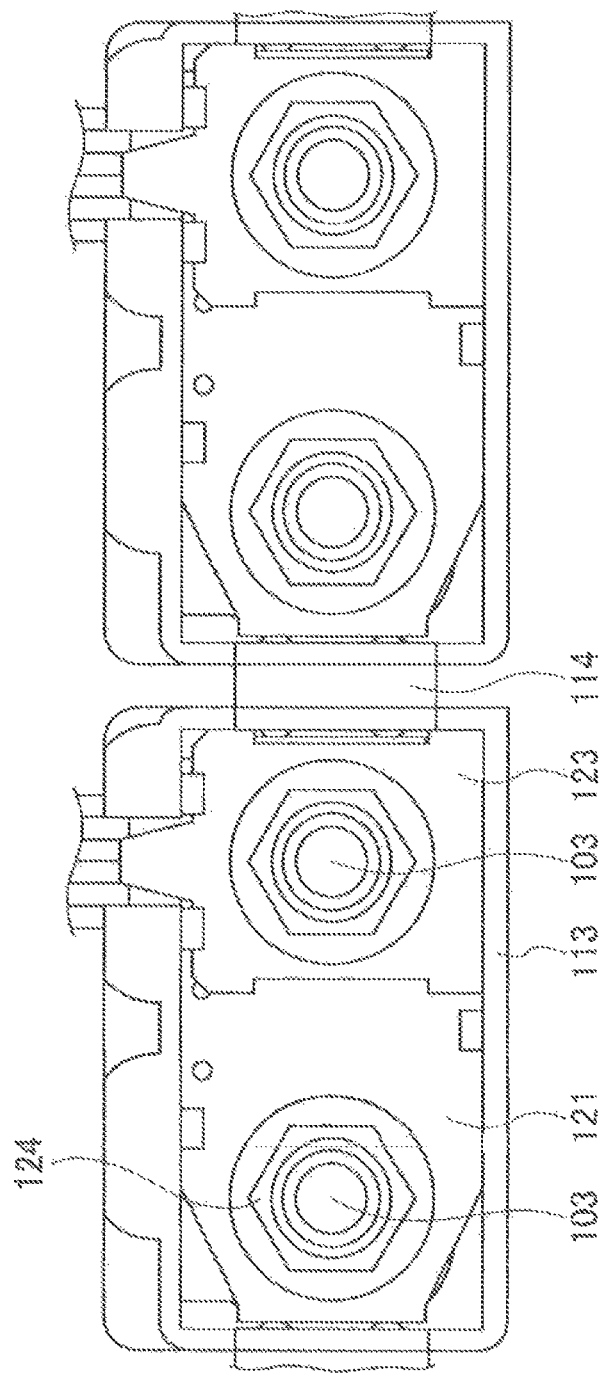

[Fig. 3]
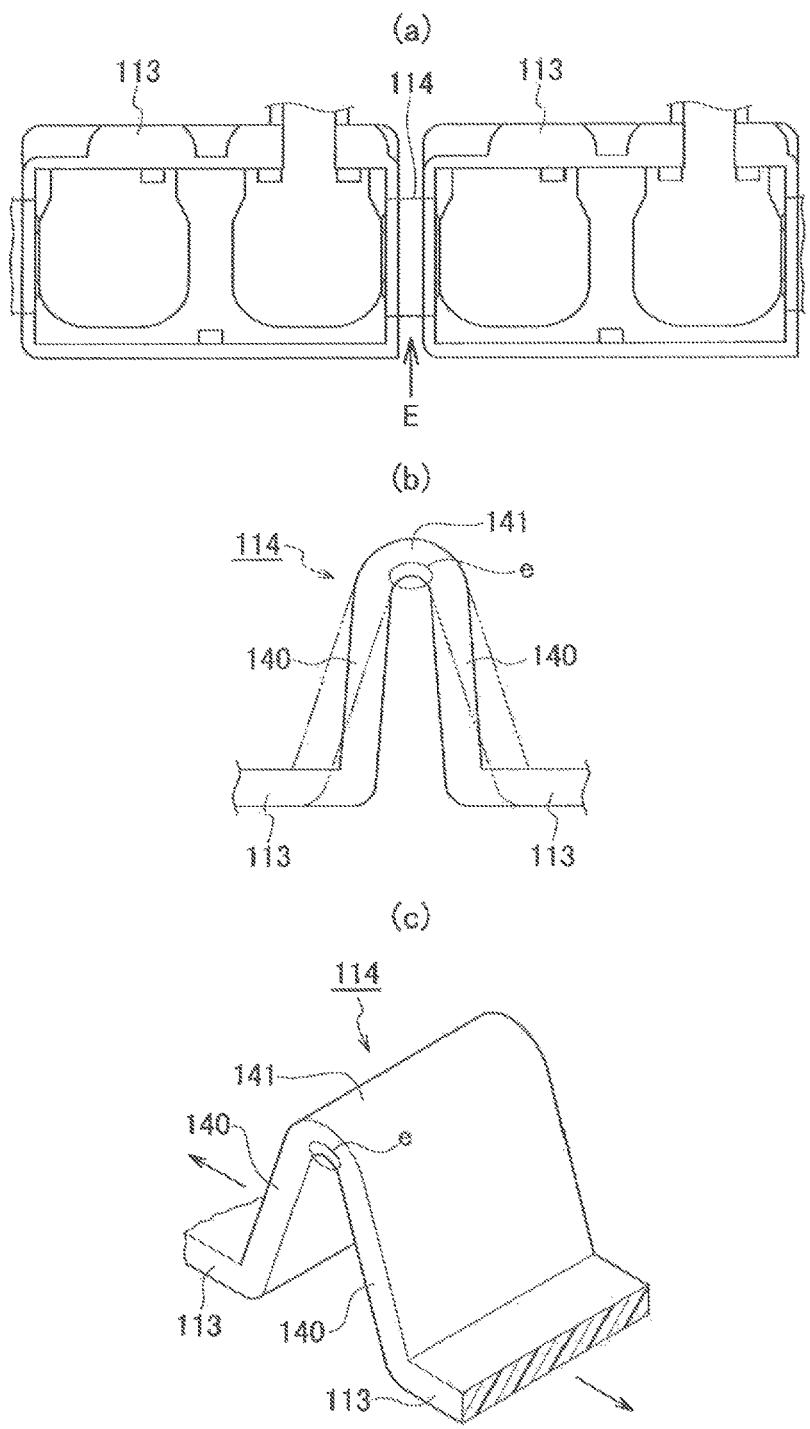

[Fig. 4]
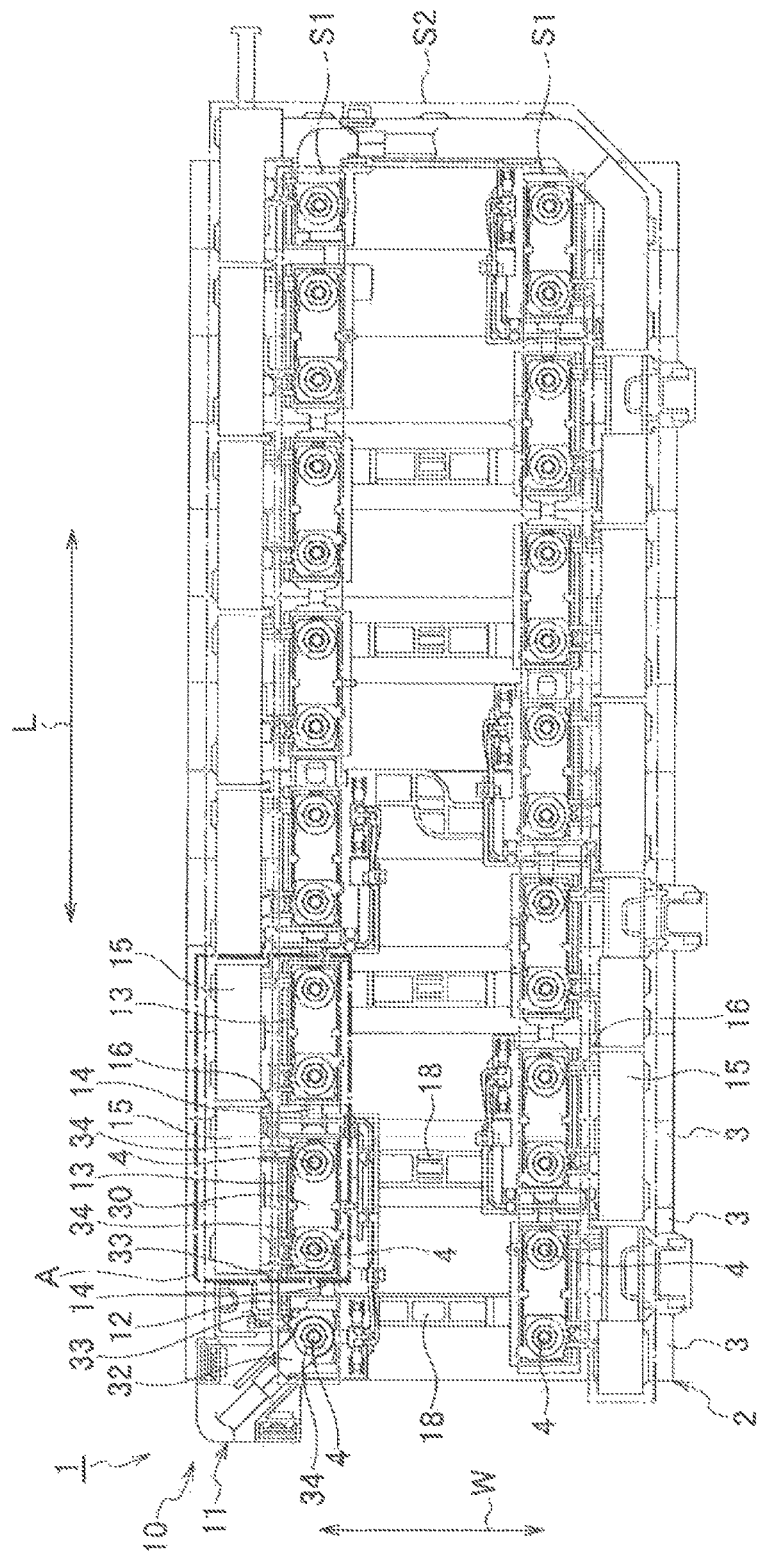

[Fig. 5]
(a)
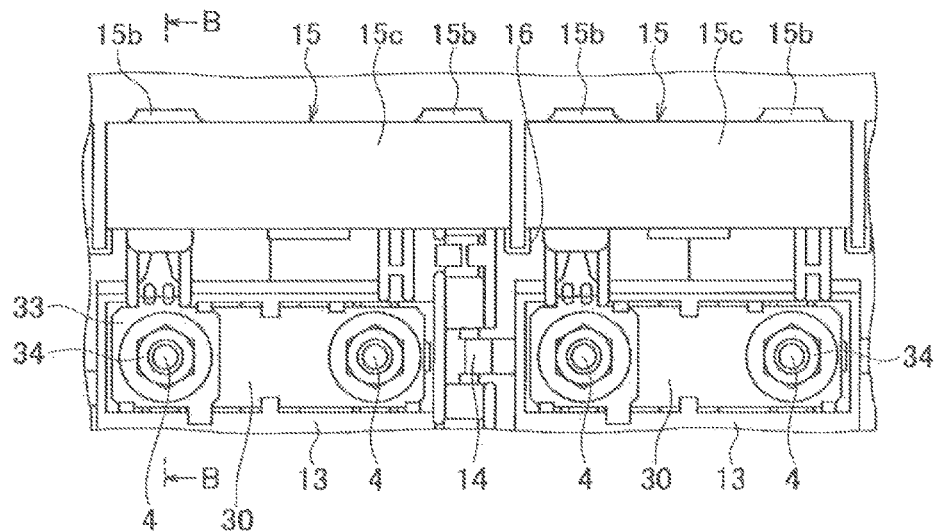
(b)
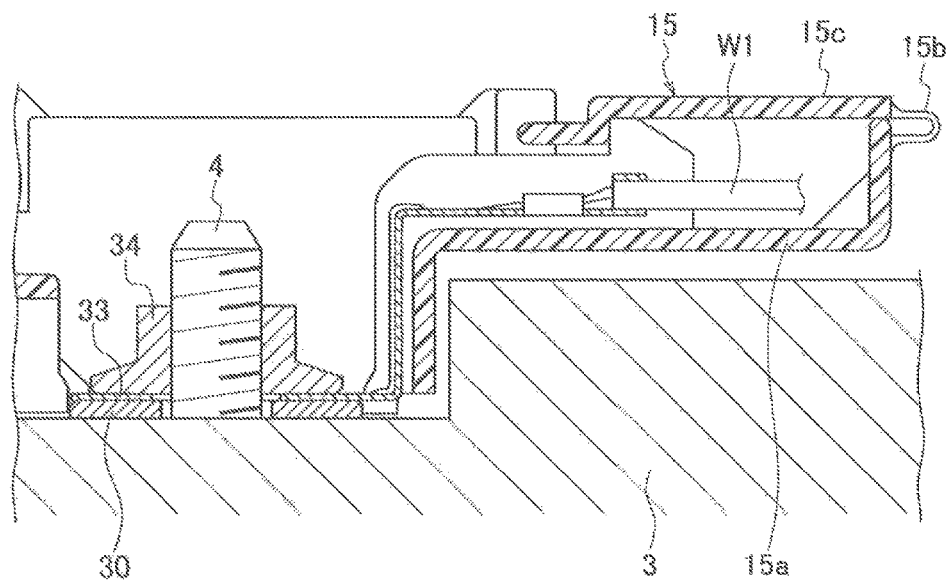

[Fig. 6]
(a)
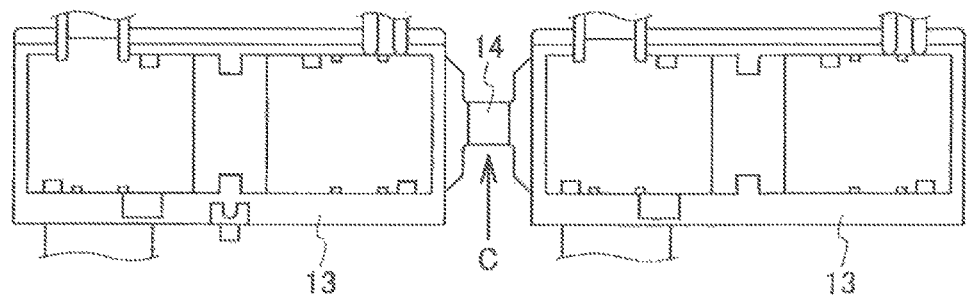
(b)
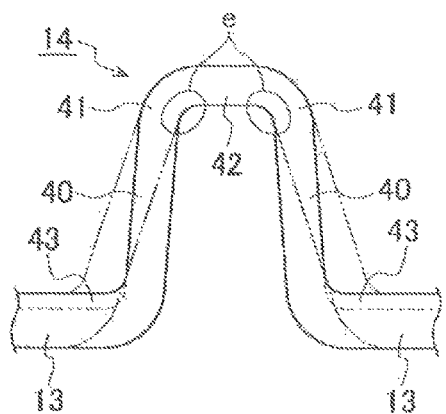
(c)
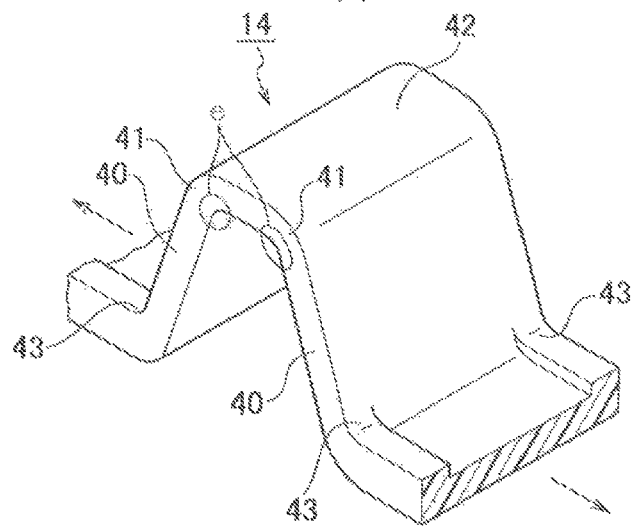

POWER SUPPLY DEVICE

TECHNICAL FIELD

The present invention relates to a power supply device in which electrodes of multiple battery cells are connected to one another.

BACKGROUND ART

A power supply device serving as a drive source of an electric motor is mounted on a hybrid vehicle or an electric vehicle, for example (see PTL 1). A related power supply device of this type is shown in FIGS. 1 to 3.

In FIGS. 1 and 2, a power supply device 100 includes a battery cell assembly 101 and a battery connecting block 110 placed on one side of the battery cell assembly 101 where electrodes of the battery cell assembly 101 protrude.

The battery cell assembly 101 has multiple battery cells 102 stacked in one direction. Each battery cell 102 is provided with a pair of electrodes (positive and negative electrodes) 103 protruding on an upper surface thereof. Each electrode 103 is in the form of a bolt.

The battery connecting block 110 includes a case body 111 made of an insulating resin, multiple connection terminals 121, a pair of output terminals 120, and multiple voltage detecting terminals 123. The connection terminals 121, the pair of output terminals 120, and the voltage detecting terminals 123 are fixed to the case body 111.

The case body 111 includes a pair of terminal fixing areas S1 and a wiring area S2. The pair of terminal fixing areas S1 are placed to extend in a longitudinal direction L on two end sides in a width direction W. The wiring area S2 is placed in a portion outward of the pair of terminal fixing areas S1 in such a manner as to surround the entire periphery of the pair of terminal fixing areas S1.

Each terminal fixing area S1 has multiple terminal fixing portions 112 and 113 serving as divided fixing portions and being arranged in a row. Every two adjacent terminal fixing portions 112 and 113 (or 113 and 113) are connected to each other via a hinge portion 114 serving as a flexural deformation portion. The pair of terminal fixing portions 112 arranged at two ends of one row are used for total power output. Each set of the output terminal 120 and voltage detecting terminal 123 is fixed to the corresponding terminal fixing portion 112 for total power output. The output terminal 120 and voltage detecting terminal 123 are fastened, with a nut 124, to the corresponding electrode 103 located at two ends of the battery cell assembly 101. Each set of the connection terminal 121 and voltage detecting terminal 123 is fixed to the corresponding terminal fixing portion 113. The connection terminal 121 is fastened to the electrodes of the adjacent battery cells 102 with the nuts 124, respectively, and the voltage detecting terminal 123 is fastened to one of these electrodes together with the connection terminal 121.

The wiring area S2 has multiple wire housing portions 115 serving as divided fixing portions and being arranged continuously. Every two adjacent wire housing portions 115 are connected to each other via a hinge portion 116 serving as a flexural deformation portion. Voltage detecting wires (not illustrated) connected to the voltage detecting terminals 123 are routed in the wire housing portions 115.

Next, the configuration of the hinge portion 114 will be described. As shown in FIGS. 3(a) to 3(c), the hinge portion 114 includes a pair of rising linear portions 140 and a curve portion 141. The pair of rising linear portions 140 have one ends respectively fixed to the adjacent terminal fixing portions 112 and 113 (or 113 and 113). The curve portion 141 connects the other ends of the pair of rising linear portions 140 to each other. The hinge portion 116 has the same configuration as the hinge portion 114.

With the above configuration, even when the dimension of the battery cell assembly 101 in the longitudinal direction L varies due to a tolerance in assembling the battery cells 102 and the like, such a tolerance is absorbed by flexural deformation of the hinge portions 114 between the terminal fixing portions 112 and 113 (or 113 and 113) and the hinge portions 116 between the wire housing portions 115.

CITATION LIST

Patent Literature

[PTL1] Japanese Unexamined Patent Application Publication No. 2011-238544

SUMMARY OF INVENTION

However, when a tensile force acts, for example, on the hinge portion 114 in the power supply device 100, the curve portion 141 is mainly flexurally deformed and thus stress is concentrated only on the curve portion 141, as shown with an imaginary line of FIG. 3(b) and a solid line of FIG. 3(c). For this reason, the stress easily exceeds the allowable stress of the material of the hinge portion 114 or 116, making the hinge portion 114 or 116 likely to be broken.

An object of the present invention is to provide a power supply device including divided fixing portions and a flexural deformation portion connecting the divided fixing portions, in which the flexural deformation portion is less likely to be broken.

A power supply device in accordance with some embodiments includes a battery cell assembly being an assembly of battery cells each having electrodes, and a battery connecting block placed on a side of the battery cell assembly where the electrodes are located, the battery connecting block including a case body including an adjacent first and second divided fixing portions connected to each other via a flexural deformation portion. The flexural deformation portion includes a first rising linear portion having one end fixed to the first divided fixing portion, a second rising linear portion having one end fixed to the second divided fixing portion, first and second curve portions bent at the other ends of the first and second rising linear portions in a direction to come close to each other, and a linear portion connecting the first and second curve portions to each other.

The flexural deformation portion may include a first set of reinforcement ribs provided at two ends of a portion for connection between the first rising linear portion and the first divided fixing portion and a second set of reinforcement ribs provided at two ends of a portion for connection between the second rising linear portion and the second divided fixing portion.

The first and second divided fixing portions may be terminal fixing portions configured to fix terminals.

The first and second divided fixing portions may be wire housing portions configured to house wires.

According to the above configuration, when the flexural deformation portion is flexurally deformed, stress is concentrated on the two curve portions, i.e., the stress is distributed and concentrated on multiple points. This prevents the stress from exceeding the allowable stress of the material of the flexural deformation portion easily and thus makes the flexural deformation portion less likely to be broken.

BRIEF DESCRIPTION OF DRAWINGS

FIG. 1 is an overall perspective view of a power supply device according to a related example.

FIG. 2 is an enlarged view of the part D of FIG. 1.

FIGS. 3 (a) to 3 (c) also show the related example, in which FIG. 3 (a) is a plan view showing a main portion of a case body, FIG. 3 (b) is an enlarged view of FIG. 3 (a) as seen in the direction of the arrow E, and FIG. 3 (c) is a perspective view showing a state of flexural deformation of a hinge portion.

FIG. 4 is an overall plan view of a power supply device according to an embodiment of the present invention.

FIG. 5(a) is an enlarged view of the part A of FIG. 4, and FIG. 5 (b) is a cross-sectional view taken along the B-B line in FIG. 5(a).

FIGS. 6 (a) to 6 (c) also show the embodiment of the present invention, in which FIG. 6 (a) is a plan view showing a main portion of a case body, FIG. 6 (b) is an enlarged view of FIG. 6(a) as seen in the direction of the arrow C, and FIG. 6 (c) is a perspective view showing a state of flexural deformation of a hinge portion.

DESCRIPTION OF EMBODIMENTS

Hereinbelow, an embodiment of the present invention will be descried based on the drawings.

FIGS. 4 to 6 show the embodiment of the present invention. As shown in FIGS. 4 and 5, a power supply device 1 includes a battery cell assembly 2 and a battery connecting block 10 placed on one side of the battery cell assembly 2 where electrodes of the battery cell assembly 2 protrude.

The battery cell assembly 2 is an assembly of multiple battery cells 3 stacked in one direction. Each battery cell 3 is provided with a pair of electrodes (positive and negative electrodes) 4 protruding on an upper surface thereof. Each electrode 4 is in the form of a bolt.

The battery connecting block 10 includes a case body 11 made of an insulating resin, multiple connection terminals 30, a pair of output terminals 32, and multiple voltage detecting terminals 33. The connection terminals 30, the pair of output terminals 32, and the voltage detecting terminals 33 are fixed to the case body 11.

The case body 11 includes a pair of terminal fixing areas S1 and a wiring area S2. The pair of terminal fixing areas S1 are placed to extend in a longitudinal direction L on two end sides in a width direction W. The wiring area S2 is placed in the form of a "U" shape in a portion outward of the pair of terminal fixing areas S1.

Each terminal fixing area S1 has multiple terminal fixing portions 12 and 13 serving as divided fixing portions and being arranged in a row. Every two adjacent terminal fixing portions 12 and 13 (or 13 and 13) are connected to each other via a hinge portion 14 serving as a flexural deformation portion. The pair of terminal fixing portions 12 arranged at two ends of one row are used for total power output. Each set of the output terminal 32 and voltage detecting terminal 33 is fixed to the corresponding terminal fixing portion 12 for total power output. The output terminal 32 and voltage detecting terminal 33 are fastened, with a nut 34, to the corresponding electrode 4 located at two ends of the battery cell assembly 2. Each set of the connection terminal 30 and voltage detecting terminal 33 is fixed to the corresponding terminal fixing portion 13. One end of the connection terminal 30 is fastened to the corresponding electrode 4 of one of the adjacent battery cells 3 with a nut 34, whereas the other end of the connection terminal 30 and the voltage detecting terminal 33 are fastened to the corresponding electrode 4 of the other battery cell 3 with a nut 34. The connection terminals 30 thus connect the electrodes 4 of the adjacent battery cells 3 to one another.

The hinge portion 14 is capable of changing an interval between every adjacent two terminal fixing portions 12 and 13 (or 13 and 13) by means of flexural deformation. The configuration of the hinge portion 14 will be described below in detail. The terminal fixing portions 12 and 13 (or 13 and 13) of the respective two rows arranged at substantially corresponding positions are connected to one another via connection arm portions 18 with some exceptions.

The wiring area S2 has multiple wire housing portions 15 serving as divided fixing portions and being arranged in a row. Every two adjacent wire housing portions 15 are connected to each other via a hinge portion 16 serving as a flexural deformation portion. Each wire housing portion 15 includes a housing base portion 15a, a hinge portion 15b, and a lid 15c connected to the housing base portion 15a via the hinge portion 15b. A voltage detecting wire W1 connected to the voltage detecting terminal 33 is guided into the nearest wire housing portion 15 and routed by use of the wire housing portions 15 continuous from the nearest wire housing portion 15.

Next, the configuration of the hinge portion 14 will be described. As shown in FIGS. 6(a) to 6(c), the hinge portion 14 includes a pair of rising linear portions 40, a pair of curve portions 41, and a linear portion 42. The pair of rising linear portions 40 have one ends respectively fixed to the adjacent terminal fixing portions 12 and 13 (or 13 and 13). The pair of curve portions 41 are bent at the other ends of the pair of rising linear portions 40 in such a direction as to come close to each other. The linear portion 42 connects the pair of curve portions 41 to each other. A pair of reinforcement ribs 43 are attached to two ends of each portion where the rising linear portion 40 and the terminal fixing portion 12 (or 13) are connected to each other.

The hinge portion 16 has the same configuration as the hinge portion 14.

With the above configuration, even when the dimension of the battery cell assembly 2 in the longitudinal direction L varies due to a tolerance in assembling the battery cells 3 and the like, such a variation is absorbed by flexural deformation of the hinge portions 14 between the terminal fixing portions 12 and 13 (or 13 and 13) and the hinge portions 16 between the wire housing portions 15.

When the hinge portion 14 is flexurally deformed, as shown with an imaginary line of FIG. 6(b) and a solid line of FIG. 6(c), stress is concentrated on the two curve portions 41, i.e., the stress is distributed and concentrated on multiple points. This prevents the stress from exceeding the allowable stress of the material of the hinge portion 14 easily and thus makes the hinge portion 14 less likely to be broken. The hinge portion 16 is less likely to be broken as well due to the same reason.

The hinge portion 14 has the reinforcement ribs 43 at the two ends of each portion where the rising linear portion 40 and the terminal fixing portion 12 (or 13) are connected to each other. These reinforcement ribs 43 can prevent torsional deformation of the hinge portion 14 as much as possible and thus increase the strength of the case body 11. The hinge portion 16 is also resistant to torsional deformation due to the same reason, thereby contributing to the increase in the strength of the case body 11 as well.

The entire content of Japanese Patent Application No. 2012-015342, filed on Jan. 27, 2012, is herein incorporated by reference.

The invention claimed is:

1. A power supply device comprising:
a battery cell assembly being an assembly of battery cells each having electrodes; and
a battery connecting block placed on a side of the battery cell assembly where the electrodes are located, the battery connecting block comprising a case body including an adjacent first and second divided fixing portions connected to each other in a first direction via a flexural deformation portion,
wherein the flexural deformation portion is substantially U-shaped and includes
a first rising linear portion having one end fixed to the first divided fixing portion,
a second rising linear portion having one end fixed to the second divided fixing portion,
first and second curve portions, and
a linear portion connecting the first and second curve portions to each other,
wherein the first curve portion bends at the other end of the first rising linear portion at a side of one surface of the linear portion and the second curve portion bends at the other end of the second rising linear portion at the side of the one surface of the linear portion,
wherein the flexural deformation portion comprises:
a first portion for connection between the first rising linear portion and the first divided fixing portion; and
a second portion for connection between the second rising linear portion and the second divided fixing portion,
wherein the first portion for connection comprises:
a first central portion located at a center of the first portion for connection in a second direction perpendicular to the first direction; and
a first set of reinforcement ribs located at both sides of the first central portion in the second direction, extending in the first direction, and having a thickness greater than a thickness of the first central portion, and
wherein the second portion for connection comprises:
a second central portion located at a center of the second portion for connection in the second direction; and
a second set of reinforcement ribs located at both sides of the second central portion in the second direction, extending in the first direction, and having a thickness greater than a thickness of the second central portion.

2. The power supply device according to claim 1, wherein the first and second divided fixing portions are terminal fixing portions configured to fix terminals.

3. The power supply device according to claim 1, wherein the first and second divided fixing portions are wire housing portions configured to house wires.

4. The power supply device according to claim 1, wherein a stress caused by deformation of the flexural deformation portion is distributed to a plurality of locations on the flexural deformation portion.

5. The power supply device according to claim 4, wherein the plurality of locations comprises a first location provided on the first curve portion and a second location provided on the second curve portion.

6. The power supply device according to claim 1, wherein the linear portion has a length extending from the first curve portion to the second curve portion so as to separate the first curve portion from the second curve portion.

7. The power supply device according to claim 1, wherein the linear portion is configured to refrain from deforming during deformation of the flexural deformation portion.

8. The power supply device according to claim 1, wherein the flexural deformation portion is substantially U-shaped from the one end of the first rising linear portion to the one end of the second rising linear portion.

9. The power supply device according to claim 1,
wherein the first rising linear portion extends only to one side of the first divided fixing portion, and
wherein the second rising linear portion extends only to one side of the second divided fixing portion.

* * * * *